United States Patent
Sharda et al.

(10) Patent No.: US 8,525,597 B2
(45) Date of Patent: Sep. 3, 2013

(54) CLOCK FREQUENCY OVERSHOOT DETECTION CIRCUIT

(75) Inventors: Garima Sharda, Noida (IN); Sunny Gupta, Noida (IN)

(73) Assignee: Freescale Semiconductor, Inc, Austin, TX (US)

( * ) Notice: Subject to any disclaimer, the term of this patent is extended or adjusted under 35 U.S.C. 154(b) by 202 days.

(21) Appl. No.: 13/288,036

(22) Filed: Nov. 3, 2011

(65) Prior Publication Data

US 2013/0113572 A1    May 9, 2013

(51) Int. Cl.
*H03L 7/00*    (2006.01)
(52) U.S. Cl.
USPC ............ 331/34; 331/1 A; 331/11; 327/159
(58) Field of Classification Search
USPC ............... 327/158, 160, 161; 331/1 A, 34, 331/57, 179; 375/376
See application file for complete search history.

(56) References Cited

U.S. PATENT DOCUMENTS

| | | | |
|---|---|---|---|
| 6,215,834 B1 | 4/2001 | McCollough | |
| 6,803,826 B2 * | 10/2004 | Gomm et al. | 331/11 |
| 6,917,658 B2 | 7/2005 | Fernald | |
| 7,038,511 B2 * | 5/2006 | Kim et al. | 327/158 |
| 7,079,615 B2 * | 7/2006 | Bailey | 375/376 |
| 7,181,146 B1 | 2/2007 | Yorks | |
| 7,501,900 B2 | 3/2009 | Hull | |
| 7,714,619 B2 | 5/2010 | Yamada | |
| 7,733,675 B2 | 6/2010 | Wu | |
| 2007/0121624 A1 | 5/2007 | Kimbrough | |

OTHER PUBLICATIONS

Christopher G. Knight, Adit D. Singh, and Victor P. Nelson, An IDDQ sensor for concurrent timing error detection, IEEE Journal of Solid-State Circuits, vol. 33, Issue 10, IEEE Solid-State Circuits Society, Oct. 1998, pp. 1545-1550.

* cited by examiner

*Primary Examiner* — Joseph Chang
*Assistant Examiner* — Jeffrey Shin
(74) *Attorney, Agent, or Firm* — Charles Bergere

(57) ABSTRACT

An electronic circuit operating on a first clock signal includes a clock frequency overshoot detection circuit for detecting frequency overshoots in the first clock signal. The clock frequency overshoot detection circuit includes a shift register having an even number plurality of flip-flops. The flip-flops toggle to generate output bit patterns indicative of a frequency overshoot condition. A comparator connected to the shift register generates a comparison signal on detecting the frequency overshoot condition. A latch circuit connected to the comparator generates a frequency overshoot indication signal and the electronic circuit is shifted to a second (or safe) clock signal until the frequency of the first clock signal is rectified.

20 Claims, 2 Drawing Sheets

CLOCK FREQUENCY OVERSHOOT DETECTION CIRCUIT

BACKGROUND OF THE INVENTION

The present invention relates to frequency overshoot detection circuits, and, more particularly, to clock frequency overshoot detection circuits.

Electronic circuits such as microprocessors, microcontroller units (MCUs), system-on-chips (SOCs), and application specific integrated circuits (ASICs) are widely used in applications including industrial applications, automobiles, home appliances, and mobile and handheld devices. As an important safety critical example, MCUs are used to monitor and control critical functions in an automobile such as opening of airbags. Electronic circuits include a clock source (e.g. a phased-locked loop (PLL)) that generates a clock signal that is required for the functioning of the internal synchronous circuit elements (and certain external communication protocols) of the electronic circuit. However, the clock signal is prone to frequency overshoots when the clock source malfunctions due to an internal fault or an external disturbance. An increase in clock frequency beyond operating limits also can lead to functional failures of the electronic circuit.

Frequency overshoots may be caused for a number of reasons. Ionization and mechanical failure of crystals used in crystal oscillators, which are the primary source of the input clock to PLLs, lead to disturbances in the clock signal and introduce glitches in the clock signal. The closed loop nature of the PLL causes the output clock signal of the PLL to overshoot in frequency in response to the input glitches. Voltage-controlled oscillators (VCOs) are used to generate clock signals in a PLL. Unwanted fluctuations in the VCO gain or input voltage also may cause the clock frequency to overshoot. Additionally, dynamic circuit faults can lead to overshoots in the clock frequency.

Critical circuit or timing paths (logical connections of internal elements in an electronic circuit) are designed to operate at a maximum target frequency for the worst process, voltage and temperature (PVT) conditions, by applying a de-rating factor of about (+/−) 2% to the maximum frequency of operation. For example, for a circuit having a maximum operating frequency of 128 MHz, the critical circuit paths are timed to operate at a maximum frequency of 132 MHz. However, if the PLL clock frequency increases beyond the maximum frequency, the critical circuit paths may function erratically and introduce functional failures in the electronic circuit. Hence, it is important to detect clock signal frequency overshoots that are greater than the circuit's maximum frequency.

Various techniques are used to detect frequency overshoots in a clock signal. One such technique uses a combination of frequency comparators formed using counters and reference clocks (e.g. internal resistive-capacitive (RC) oscillators that are reliable compared to crystal oscillators) to detect overshoots in the clock frequency. The frequency comparator and the reference counter compare the input and feedback clock frequencies to detect frequency overshoots. Another technique uses clock monitoring circuits (including counters and reference clocks) to detect frequency overshoots in a clock signal. However, both of these techniques suffer from a slow response time, which is the time taken by a frequency overshoot detection circuit to detect an overshoot after the occurrence of the overshoot. The response time of existing systems is relatively high and varies in the range of a few 100 clock cycles. With such a slow response time, the frequency overshoots more often than not go undetected if the overshoot duration is small (e.g. 20-30 clock cycles). Since the electronic circuit can perform many operations in 20-30 clock cycles, it continues to operate with a bad clock signal, causing functional failures in critical timing paths and causing the electronic circuit to function erratically.

Therefore, it would be advantageous to have a clock frequency overshoot detection circuit with a fast response time. It further would be advantageous to have a clock frequency overshoot detection circuit that provides flexibility in design to eliminate the possibility of frequency overshoots going undetected. It also would be advantageous to have a clock frequency overshoot detection circuit that is simple, cost-effective, and reliable enough to overcome the above-mentioned drawbacks.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
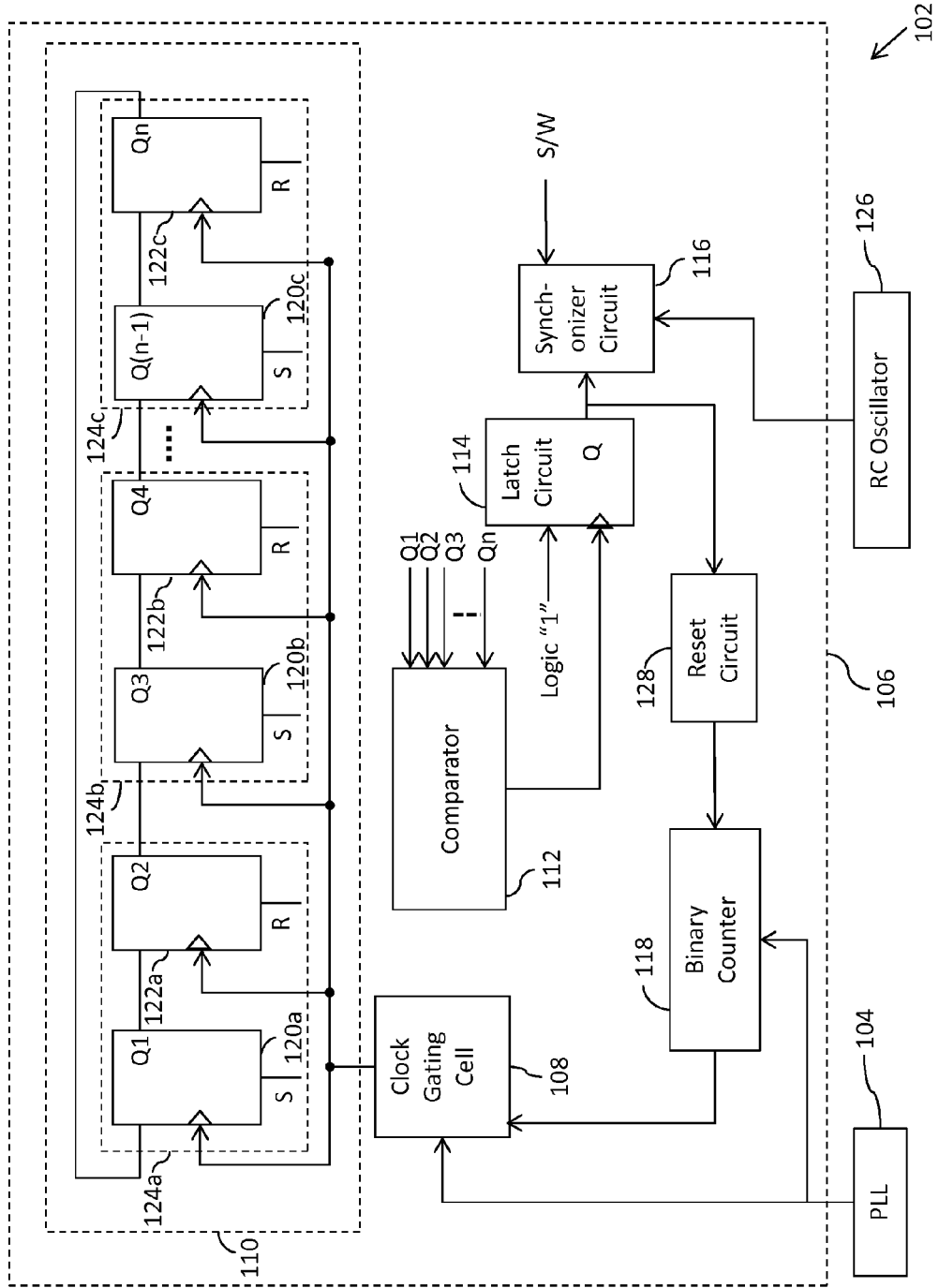
FIG. 1 is a schematic block diagram of an electronic circuit in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a clock frequency overshoot detection circuit is provided. The clock frequency overshoot detection circuit includes a clock gating cell for receiving a first clock signal and generating a gated clock signal based on a count signal. A shift register is connected to the clock gating cell and includes at least two pairs of flip-flops. Each pair of flip-flops includes a set flip-flop and a reset flip-flop. An input terminal of each flip-flop is connected to an output terminal of a previous flip-flop and an output terminal of a last flip-flop is connected to an input terminal of a first flip-flop. The gated clock signal is provided to respective clock inputs of each of the flip-flops such that an output of each of the flip-flops toggles at each pulse of the gated clock signal and an output bit pattern is generated. A comparator is connected to the output terminals of each of the flip-flops for generating a comparison signal. A latch circuit is connected to the comparator and includes a clock input for receiving the comparison signal and a data input terminal for receiving a predefined logic value. The latch circuit generates a frequency overshoot indication signal. A binary counter is connected to the clock gating cell. The binary counter generates and provides the count signal to the clock gating cell.

In another embodiment of the present invention, an electronic circuit is provided. The electronic circuit receives a first clock signal from a clock generation circuit and includes a clock frequency overshoot detection circuit for detecting a frequency overshoot in the first clock signal. The clock frequency overshoot detection circuit includes a clock gating cell for receiving the first clock signal and generating a gated clock signal based on a count signal. A shift register is connected to the clock gating cell and includes at least two pairs of flip-flops. Each pair of flip-flops includes a set flip-flop and a reset flip-flop. An input terminal of each flip-flop is connected to an output terminal of a previous flip-flop and an output terminal of a last flip-flop is connected to an input terminal of a first flip-flop. The gated clock signal is provided to respective clock inputs of each of the flip-flops such that an output of each of the flip-flops toggles at each pulse of the gated clock signal and an output bit pattern is generated. A comparator is connected to the output terminals of each of the flip-flops for generating a comparison signal. A latch circuit is connected to the comparator and includes a clock input for receiving the comparison signal and a data input terminal for receiving a predefined logic value. The latch circuit generates a frequency overshoot indication signal. A binary counter is connected to the clock gating cell. The binary counter generates and provides the count signal to the clock gating cell.

In yet another embodiment of the present invention, a clock frequency overshoot detection circuit is provided. The clock frequency overshoot detection circuit includes a clock gating cell for receiving a first clock signal and generating a gated clock signal based on a count signal. A 32-bit shift register is connected to the clock gating cell and includes sixteen pairs of flip-flops. Each of the sixteen pairs of flip-flops includes a set flip-flop and a reset flip-flop. An input terminal of each flip-flop is connected to an output terminal of a previous flip-flop and an output terminal of a last flip-flop is connected to an input terminal of a first flip-flop. The gated clock signal is provided to respective clock inputs of each of the flip-flops such that an output of each of the flip-flops toggles at each pulse of the gated clock signal and an output 32-bit pattern is generated. A comparator is connected to the output terminals of each of the flip-flops for generating a comparison signal. A latch circuit is connected to the comparator and includes a clock input for receiving the comparison signal and a data input terminal for receiving a predefined logic value. The latch circuit generates a frequency overshoot indication signal. A binary counter is connected to the clock gating cell. The binary counter generates and provides the count signal to the clock gating cell.

Various embodiments of the present invention provide a clock frequency overshoot detection circuit for detecting frequency overshoots in an input clock signal and an electronic circuit including the clock frequency overshoot detection circuit. The frequency overshoots cause the set and reset flip-flops to toggle and generate faulty bit patterns indicative of a frequency overshoot condition. The faulty bit patterns cause the comparator output to go HIGH, which in turn triggers the latch circuit. The latch circuit generates a frequency overshoot indication signal that disables the PLL clock signal. The electronic circuit is switched to a second (or safe) clock signal (of much lower or same clock frequency) that prevents critical circuit paths within the electronic circuit from operating erratically. Once the PLL clock signal is rectified, the electronic circuit shifts back to the PLL clock signal. Thus the electronic circuit is protected from any failures caused by frequency overshoots in the clock signal.

The shift register used in the clock frequency overshoot detection circuit is flexible enough to accommodate any even number of flip-flops (e.g., 32 flip-flops). Increasing the number of flip-flops reduces the probability of the frequency overshoots going undetected (due to the meta-stability of flip-flops within the shift register) and improves the overall accuracy and reliability of the clock frequency overshoot detection circuit. The worst case scenario response time of the clock frequency overshoot detection circuit of the present invention equals the sum of the size of the binary counter and two clock cycles of the PLL (required for loading and capturing data from the shift register). Thus, for an N-bit binary counter, if the frequency overshoot occurs at the start of counting by the N-bit binary counter, the first clock signal is gated for "N" clock cycles. The clock frequency overshoot detection circuit takes "N" clock cycles to remove the gating, the shift register generates faulty output bit pattern after 2 clock cycles, and hence the comparator indicates a failure in a maximum of (N+2) clock cycles. The size of the binary counter can be tuned to achieve the desired response time, thereby providing flexibility of design. The response time is often kept equal to the number of clock cycles required for executing one operation in the electronic circuit. Typically, it takes four clock cycles for executing one operation, and hence the size of the binary counter is set to four to achieve improved reliability. Thus, for a 4-bit binary counter, the worst case response time of the clock frequency overshoot detection circuit equals 6 clock cycles which is considerably smaller than the response time of the existing detection systems (100 clock cycles).

Referring now to FIG. 1, a schematic diagram of an electronic circuit 102 in accordance with an embodiment of the present invention is shown. In various embodiments of the present invention, the electronic circuit 102 may be a system-on-chip (SoC), a microcontroller unit (MCU), an application specific integrated circuit (ASIC) or any other general digital circuit. The electronic circuit 102 may be used to control critical applications in automobiles. For example, the electronic circuit 102 may control the opening mechanism of airbags in an automobile.

The electronic circuit 102 includes digital logic elements or circuits that are connected in a pre-defined fashion (the connections are hereafter referred to as circuit paths). The circuit paths may operate on the same clock frequency or require different clock frequencies. The electronic circuit 102 receives a first clock signal from a clock generation circuit, such as a phased-locked loop (PLL) circuit 104. In various embodiments of present invention, the first clock signal may be generated by any other suitable clock generation circuit known in the art. Further, the PLL circuit 104 may be an externally connected circuit or may be integrated in the electronic circuit 102.

The PLL circuit 104 is pre-programmed to vary the frequency of the first clock signal to meet the clock requirements of the circuit paths. However, the frequency of the first clock signal may be prone to overshoots due to various factors including jitter, circuit faults, and crystal failures. Though the circuit paths are designed to withstand these frequency variations, overshoots beyond a permissible limit may cause the circuit paths to function erratically, due to setup violations of the digital logic elements of electronic circuit 102.

In order to protect the electronic circuit 102 from erratic behavior caused by frequency overshoots, a clock frequency overshoot detection circuit 106 is included in the electronic circuit 102. The overshoot detection circuit 106 is connected to the PLL circuit 104 and includes a clock gating cell 108, a shift register 110, a comparator 112, a latch circuit 114, a synchronizer circuit 116 and a binary counter 118. The clock gating cell 108 receives the first clock signal from the PLL circuit 104 and generates a gated clock signal. The shift register 110 is connected to the clock gating cell 108 and has an even number of flip-flops including a plurality of set flip-flops 120 and reset flip-flops 122. Note the set and reset flip-flops are referred to collectively as 120, 122. One set flip-flop 120 and one reset flip-flop 122 together form a pair of flip-flops 124 (the pairs similarly referred to collectively as 124). AS shown in FIG. 1, a first pair of flip-flops 124a includes first set and reset flip-flops 120a and 122a respectively, a second pair of flip-flops 124b includes second set and reset flip-flops 120b and 122b respectively, and so on. Although only three pairs of flip-flops are shown, that is for convenience and ease of description and it will be understood by those of skill in the art that the greater the number of flip-flops used in the shift register 110, the better the accuracy of the overshoot detection circuit 106. In an exemplary embodiment of the present invention, a shift register with 16 pairs of flip-flops has an error rate of less than 1 part per trillion, and therefore is considered extremely reliable for safety critical applications.

In various embodiments of the present invention, the set and reset flip-flops 120, 122 are D flip-flops. An output terminal Q1 of the first set flip-flop 120a is connected to an input terminal of the first reset flip-flop 122a, an output terminal Q2 of the first reset flip-flop 122a is connected to an input terminal of the second set flip-flop 120b and so on such that the flip-flops 120, 122 form a shift register. An output terminal of last reset flip-flop 122c is connected to the input terminal of the first set flip-flop 120a. The gated clock signal is provided to the clock inputs of each of the set and reset flip-flops 120 and 122. The gated clock signal ensures reliable switching of the set and reset flip-flops 120 and 122.

The set and reset flip-flops 120 and 122 toggle with each pulse of the gated clock signal and generate an output bit pattern. The output bit pattern depends on the number of set and reset flip-flops 120 and 122 in the shift register 110. For example, a 4-bit shift register may generate 16 output bit patterns. Likewise, an 8-bit shift register may generate 256 output bit patterns. In general, an n-bit shift register will generate "2" output bit patterns, each bit pattern having a length n. In the absence of a frequency overshoot in the first clock signal, the set and reset flip-flops 120 and 122 toggle to generate alternate "1"s and "0"s. Thus, a 4-bit shift register generates alternate output bit patterns of "1010" and "0101" and an 8-bit shift register generates alternate output bit patterns of "10101010" and "01010101", in the absence of frequency overshoots in the first clock signal.

The output of the shift register 110, i.e., the output terminals of the set and reset flip-flops 120 and 122, are connected to an input terminal of the comparator 112. The comparator 112 receives the output bit patterns and generates a comparison signal at an output terminal thereof. In various embodiments of the present invention, the comparator 112 is a logical comparator and formed using suitable digital logic elements. The output terminal of the comparator 112 is connected to a clock input of the latch circuit 114. The latch circuit 114 includes a data input terminal that receives a predefined logic (either logic "0" or logic "1", based on the type of the latch circuit 114). The latch circuit 114 generates a frequency overshoot indication signal at an output terminal thereof, based on the comparison signal.

The output terminal of the latch circuit 114 is connected to a first input terminal of the synchronizer circuit 116. A second input terminal of the synchronizer circuit 116 is connected to a resistive capacitive (RC) oscillator circuit 126. The RC oscillator circuit 126 is a highly reliable clock source that generates a second clock signal. The second clock signal has a frequency that is same or lower than the first clock signal and is used as a safety clock signal for the electronic circuit 102. In various embodiments of the present invention, the RC oscillator circuit 126 is integrated in the electronic circuit 102.

The synchronizer circuit 116 receives the frequency overshoot indication signal and synchronizes the operations of the circuit paths to the second clock signal, thereby preventing functional failures in the circuit paths.

The binary counter 118 is connected to the PLL circuit 104 and the clock gating cell 108. The binary counter 118 generates a count signal based on the first clock signal. The size of the binary counter 118 is programmed so as to generate a count signal after pre-determined cycles of the first clock signal. In an example, if the size of the binary counter 118 is 4, the binary counter 118 generates a count signal after 4 cycles of the first clock signal.

The count signal is received by the clock gating cell 108 which in turn generates the gated clock signal and enables the shift register 110. Thus the shift register 110 operates only for a fraction of time to detect an overshoot, which significantly helps in reducing the wear and tear of the shift register 110.

Though the shift register 110 may be designed by using any even number of flip-flops, the functioning of the clock frequency overshoot detection circuit 106 has been explained with reference to an exemplary 4-shift register (having two pairs of flip-flops 124a and 124b, respectively). Initially, the first set and reset flip-flops 120a and 122a and the second set and reset flip-flops 120b and 122b are RESET until the PLL circuit 104 is switched ON. The binary counter 118 generates the count signal. The PLL circuit 104 generates the first clock signal, which is received by the clock gating cell 108. The clock gating cell 108 generates the gated clock signal based on the count signal generated by the binary counter 118. The gated clock signal enables the comparator 112. The gated clock signal further causes the first set and reset flip-flops 120a and 122a and the second set and reset flip-flops 120b and 122b to toggle with each pulse and generate alternate output bit patterns of "1010" and "0101" (in the absence of frequency overshoots in the first clock signal). The comparator 112 receives the output bit patterns and the output of the comparator 112 remains in a low state, thereby keeping the latch circuit 114 and the synchronizer circuit 116 in a low state. Thus, the circuit paths in the electronic circuit 102 receive the first clock signal.

In case a frequency overshoot occurs in the first clock signal, the first set and reset flip-flops 120a and 122a and the second set and reset flip-flops 120b and 122b toggle to generate any of the remaining 14 output bit patterns (viz. 0000, 0001, 0010, 0011, 0100, 0110, 0111, 1000, 1001, 1011, 1100, 1101, 1110, and 1111), due to setup violations in these flip flops. These output bit patterns represent a frequency overshoot condition. The comparator 112 receives the output bit pattern and the output of the comparator 112 becomes HIGH, i.e., the comparison signal is generated. The comparison signal triggers the clock input of latch circuit 114 and causes the output of the latch circuit 114 to switch to a high state, thereby generating the frequency overshoot indication signal.

A reset circuit 128 is connected between the latch circuit 114 and the binary counter 118. The reset circuit 128 receives the frequency overshoot indication signal and resets the binary counter 118, which in turn disables the clock gating cell 108 and stops the gated clock signal to shift register 110. The reset circuit 108 further clears the first set and reset flip-flops 120a and 122a and the second set and reset flip-flops 120b and 122b. The synchronizer circuit 116 receives the frequency overshoot indication signal and synchronizes the operations of the circuit paths to the second clock signal.

The circuit paths continue to receive the second clock signal and the binary counter 118 remains at a RESET until an external circuit or software (not shown) rectifies the first clock signal. Upon rectification, the external circuit/software provides an "overshoot clearance" signal to the clock frequency overshoot detection circuit 104 indicating stabilization of the first clock signal. The binary counter 118 is subsequently removed from a RESET, and the clock gating cell 108 is enabled. The shift register 110 outputs the bit patterns of "1010" and "0101" to the comparator 112 and the output of the comparator 112 switches to a low state, which in turn disables the latch circuit 114 and the synchronizer circuit 116. The circuit paths of the electronic circuit 102 shift back to the first clock signal.

Figure 2:
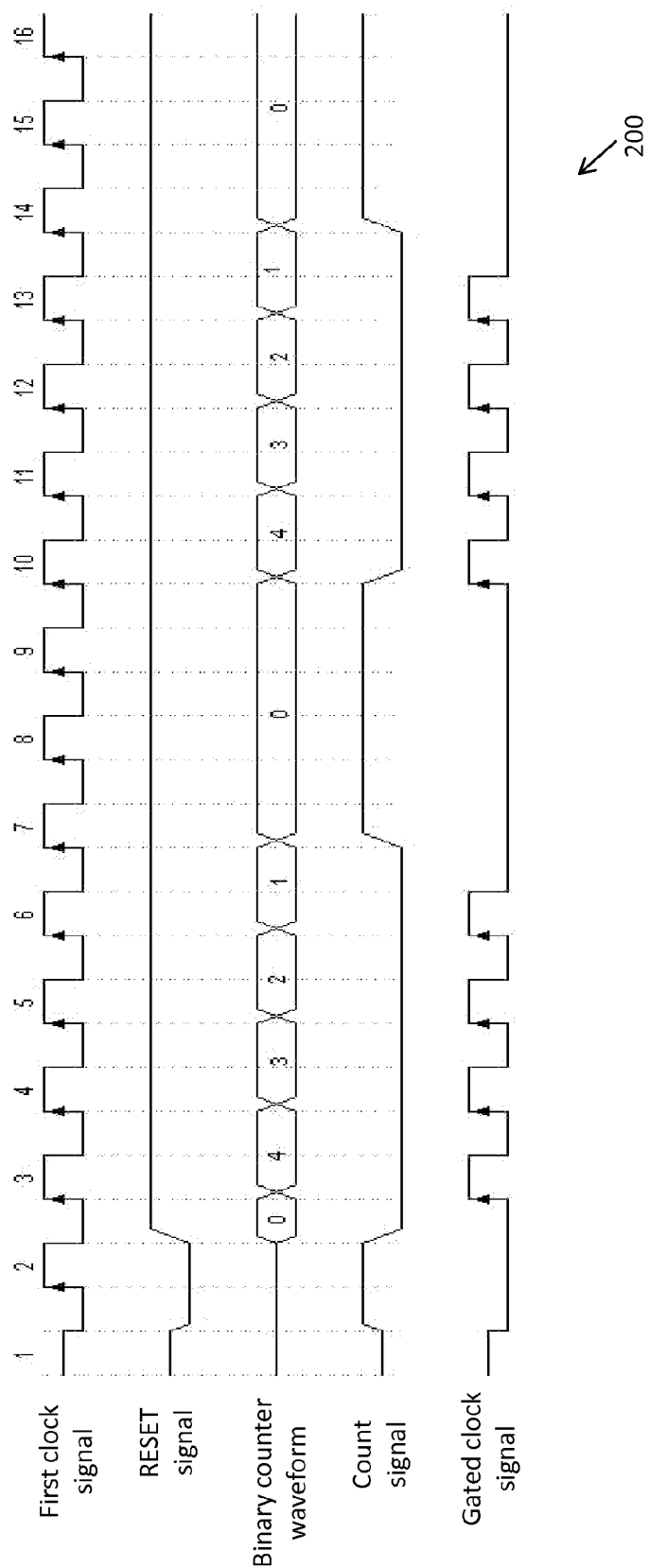
FIG. 2 is a timing diagram for some of the signals of the circuit of FIG. 1.

Referring now to FIG. 2, a timing diagram 200 corresponding to FIG. 1, in accordance with an embodiment of the present invention is shown. The timing diagram 200 includes waveforms corresponding to the first clock signal, the RESET signal, the binary counter, the count signal, and the gated clock signal. The first clock signal is the PLL clock signal generated by the PLL circuit 104. The RESET signal is generated by the reset circuit 128 and is an "active low" RESET. The RESET signal remains in a high state until the reset circuit 128 receives the frequency overshoot indication signal from the latch circuit 114. The frequency overshoot indication signal causes the RESET signal to switch to a low state, thereby resetting the binary counter 118, disabling the clock gating cell 108, stopping the gated clock signal to shift register 110, and clearing the set and reset flip-flops 120 and 122. Once the overshoot is cleared, the RESET signal switches back to a high state.

The binary counter waveform represents the four counts generated by an exemplary 4-bit binary counter. The count signal represents the input to the clock gating cell 108 from the binary counter 118. As illustrated, the count signal remains in a low state as long as the binary counter 118 counts. At count "0", the count signal switches to a high state and enables the clock gating cell 108. The count signal switches back to a low state when the binary counter 118 re-starts the count. The gated clock signal represents the output of the clock gating cell 108. The gated clock signal has the same frequency as that of the first clock signal except that it is gated for a pre-determined amount of time and remains in a low state when the count signal remains in a high state. The low state of the gated clock signal enables the shift register 110 and causes the set and reset flip-flops 120 and 122 to toggle. The gating is removed when the count signal switches to a low state.

The flip-flops used in the shift register 110 are prone to a metastable behavior and may cause the shift register 110 to generate output bit patterns indicative of a safe clock signal (alternate 1s and 0s) in spite of the presence of frequency overshoots in the first clock signal. However, the clock frequency overshoot detection circuit 104 of the present invention is designed to be flexible enough to reduce the probability of occurrence of such faulty bit patterns. The worst case analysis is performed by assuming all the flip-flops to have an equal probability to end up in either of the two safe states after the metastable behavior has settled down.

Number of flops in shift register=$2n$ (where $n \geq 2$)

Number of "correct states"=2 (alternate 1's and 0's)

Probability of occurrence of faulty bit patterns at high frequencies (false pass)=$2/(2^{2n})=0.5/(2^n)$ Thus, the probability of occurrence of faulty bit patterns decreases exponentially with the increase in the number of flip-flops in the shift register 110 and improves the overall accuracy and reliability of the clock frequency overshoot detection circuit 104.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A clock frequency overshoot detection circuit, comprising:
    a clock gating cell for receiving a first clock signal and generating a gated clock signal based on a count signal;
    a shift register connected to the clock gating cell and including at least two pairs of flip-flops, wherein each pair of flip-flops includes a set flip-flop and a reset flip-flop, and wherein an input terminal of each flip-flop is connected to an output terminal of a previous flip-flop and an output terminal of a last flip-flop is connected to an input terminal of a first flip-flop, and wherein the gated clock signal is provided to respective clock inputs of each of the flip-flops such that an output of each of the flip-flops toggles at each pulse of the gated clock signal, thereby generating an output bit pattern;
    a comparator, connected to the output terminals of each of the flip-flops, for generating a comparison signal;
    a latch circuit, connected to the comparator, and having a clock input for receiving the comparison signal and a data input terminal for receiving a predefined logic value, wherein the latch circuit outputs a frequency overshoot indication signal; and
    a binary counter, connected to the clock gating cell, for generating and providing the count signal to the clock gating cell.

2. The clock frequency overshoot detection circuit of claim 1, wherein the first clock signal is generated by a phase-locked loop (PLL) circuit.

3. The clock frequency overshoot detection circuit of claim 1, wherein the clock frequency overshoot detection circuit is integrated in an electronic circuit that functions using the first clock signal.

4. The clock frequency overshoot detection circuit of claim 3, further comprising a resistive-capacitive (RC) oscillator circuit that generates a second clock signal.

5. The clock frequency overshoot detection circuit of claim 4, further comprising a synchronizer circuit having a first input terminal connected to the latch circuit and receiving the frequency overshoot indication signal and a second input terminal connected to the RC oscillator circuit and receiving the second clock signal, wherein the synchronizer circuit synchronizes the operation of the electronic circuit to the second clock signal based on the frequency overshoot indication signal.

6. The clock frequency overshoot detection circuit of claim 5, further comprising a reset circuit, connected between the synchronizer circuit and the binary counter, for providing a RESET signal to the binary counter.

7. The clock frequency overshoot detection circuit of claim 1, wherein each of the flip-flops is a D flip-flop.

8. The clock frequency overshoot detection circuit of claim 1, wherein the comparator circuit is formed with digital logic circuits.

9. An electronic circuit that receives a first clock signal from a clock generation circuit, comprising;
    a clock frequency overshoot detection circuit for detecting a frequency overshoot in the first clock signal, wherein the clock frequency overshoot detection circuit includes, a clock gating cell for receiving the first clock signal and generating a gated clock signal based on a count signal;

a shift register connected to the clock gating cell and including at least two pairs of flip-flops, wherein each pair of flip-flops includes a set flip-flop and a reset flip-flop, and wherein an input terminal of each flip-flop is connected to an output terminal of a previous flip-flop and an output terminal of a last flip-flop is connected to an input terminal of a first flip-flop, and wherein the gated clock signal is provided to respective clock inputs of each of the flip-flops such that an output of each of the flip-flops toggles at each pulse of the gated clock signal, thereby generating an output bit pattern;

a comparator, connected to the output terminals of each of the flip-flops, for generating a comparison signal;

a latch circuit, connected to the comparator and having a clock input for receiving the comparison signal and a data input terminal for receiving a predefined logic value, wherein the latch circuit outputs a frequency overshoot indication signal; and a binary counter, connected to the clock gating cell, for generating and providing the count signal to the clock gating cell.

10. The electronic circuit of claim 9, wherein the electronic circuit further receives a second clock signal generated by a resistive-capacitive (RC) oscillator circuit.

11. The electronic circuit of claim 10, further comprising a synchronizer circuit having a first input terminal connected to the latch circuit and receiving the frequency overshoot indication signal and a second input terminal connected to the RC oscillator circuit and receiving a second clock signal, wherein the synchronizer circuit synchronizes the operation of the electronic circuit to the second clock signal based on the frequency overshoot indication signal.

12. The electronic circuit of claim 11, further comprising a reset circuit connected between the synchronizer circuit and the binary counter, for providing a RESET signal to the binary counter.

13. The electronic circuit of claim 9, wherein each of the flip-flops is a D flip-flop.

14. The electronic circuit of claim 9, wherein the comparator circuit is formed with digital logic circuits.

15. A clock frequency overshoot detection circuit, comprising:

a clock gating cell for receiving a first clock signal and generating a gated clock signal based on a count signal;

a 32-bit shift register connected to the clock gating cell and including sixteen pairs of flip-flops, wherein each of the sixteen pairs of flip-flops includes a set flip-flop and a reset flip-flop, and wherein an input terminal of each flip-flop is connected to an output terminal of a previous flip-flop and an output terminal of a last flip-flop is connected to an input terminal of a first flip-flop, and wherein the gated clock signal is provided to respective clock inputs of each of the flip-flops such that an output of each of the flip-flops toggles at each pulse of the gated clock signal, thereby generating an output 32-bit pattern;

a comparator, connected to the output terminals of each of the flip-flops, for generating a comparison signal;

a latch circuit, connected to the comparator and having a clock input for receiving the comparison signal and a data input terminal for receiving a predefined logic value, wherein the latch circuit outputs a frequency overshoot indication signal; and a binary counter, connected to the clock gating cell, for generating and providing the count signal to the clock gating cell.

16. The clock frequency overshoot detection circuit of claim 15, wherein the first clock signal is generated by a phase-locked loop (PLL) circuit.

17. The clock frequency overshoot detection circuit of claim 15, wherein the electronic circuit further receives a second clock signal generated by a resistive-capacitive (RC) oscillator circuit.

18. The clock frequency overshoot detection circuit of claim 17, further comprising a synchronizer circuit having a first input terminal connected to the latch circuit and receiving the frequency overshoot indication signal and a second input terminal connected to the RC oscillator circuit and receiving a second clock signal, wherein the synchronizer circuit synchronizes the operation of the electronic circuit to the second clock signal based on the frequency overshoot indication signal.

19. The clock frequency overshoot detection circuit of claim 18, further comprising a reset circuit connected between the synchronizer circuit and the binary counter, for providing a RESET signal to the binary counter.

20. The clock frequency overshoot detection circuit of claim 15, wherein each of the flip-flops is a D flip-flop.

* * * * *